US 6,593,043 B2

(12) United States Patent
Suwa et al.

(10) Patent No.: US 6,593,043 B2
(45) Date of Patent: Jul. 15, 2003

(54) COMPOSITION OF POSITIVE PHOTOSENSITIVE RESIN PRECURSOR, AND DISPLAY DEVICE THEREOF

(75) Inventors: Mitsuhito Suwa, Otsu (JP); Kazuto Miyoshi, Otsu (JP); Masao Tomikawa, Otsu (JP)

(73) Assignee: Toray Industries, Inc., Tokyo (JP)

( * ) Notice: Subject to any disclaimer, the term of this patent is extended or adjusted under 35 U.S.C. 154(b) by 68 days.

(21) Appl. No.: 09/985,059

(22) Filed: Nov. 1, 2001

(65) Prior Publication Data

US 2002/0090564 A1 Jul. 11, 2002

(30) Foreign Application Priority Data

Nov. 27, 2000 (JP) ........................................ 2000-359401
Apr. 20, 2001 (JP) ........................................ 2001-122334

(51) Int. Cl.[7] ................................................ G03F 7/023
(52) U.S. Cl. ............................ 430/18; 430/20; 430/28; 430/165; 430/191; 430/192; 430/193
(58) Field of Search ................................. 430/18, 20, 28, 430/169, 191, 192, 193

(56) References Cited

U.S. PATENT DOCUMENTS

| 5,376,499 | A | * | 12/1994 | Hammerschmidt et al. . 430/192 |
| 5,518,864 | A | * | 5/1996 | Oba et al. .................... 430/325 |
| 5,753,407 | A | * | 5/1998 | Oba .......................... 430/191 |
| 5,858,584 | A | * | 1/1999 | Okabe et al. ................. 430/18 |
| 6,177,225 | B1 | * | 1/2001 | Weber et al. ................ 430/190 |
| 6,329,110 | B1 | * | 12/2001 | Nunomura et al. ........... 430/18 |
| 6,376,151 | B1 | * | 4/2002 | Takahashi et al. .......... 430/192 |
| 6,514,658 | B2 | * | 2/2003 | Nunomura et al. ......... 430/191 |

* cited by examiner

Primary Examiner—John S. Chu
(74) Attorney, Agent, or Firm—Kubovcik & Kubovcik

(57) ABSTRACT

A composition of a positive photosensitive resin precursor includes (a) a polyamic acid ester and/or a polyamic acid each having at least one selected from a carboxyl group, a phenolic hydroxyl group, a sulfonic acid group and a thiol group at the end of a principal chain of the polymer, (b) a compound having a phenolic hydroxyl group, and (c) a quinonediazide sulfnate. The composition can be subjected to dissolution in an alkaline developer.

14 Claims, No Drawings

COMPOSITION OF POSITIVE PHOTOSENSITIVE RESIN PRECURSOR, AND DISPLAY DEVICE THEREOF

BACKGROUND OF THE INVENTION

1. Field of the Invention

The present invention relates to a composition of a positive photosensitive polyimide precursor, which is suitable as a surface protective layer and interlayer dielectric of a semiconductor device and an insulating layer of an organic electroluminescent device. In the resulting positive photosensitive polyimide precursor, exposed portions irradiated with ultraviolet rays are dissolved in an alkaline aqueous solution.

2. Description of the Related Art

Known compositions of positive heat-resistant resin precursors, in which exposed portions are dissolved by alkali-development, include a composition containing a polyamic acid with a naphthoquinonediazide, a composition containing a soluble polyimide having a hydroxyl group with a naphthoquinonediazide, and a composition containing a polyamide having a hydroxyl group with a naphthoquinonediazide.

However, such a composition containing a conventional polyamic acid with a naphthoquinonediazide cannot yield a desired pattern in most cases, since high solubility of the carboxyl group of the polyamic acid overcomes dissolution-inhibitory effect of the naphthoquinonediazide to an alkaline developer. In order to control the alkaline solubility of a polyamic acid, a polyamic acid derivative in which the carboxyl group of the polyamic acid is protected with an ester group has been developed.

However, a composition containing the above polyamic acid derivative with a naphthoquinonediazide exhibits very high dissolution-inhibitory effect to an alkaline developer due to the naphthoquinonediazide, therefore cannot be developed in a short time (hereinafter referred to as "low sensitivity") and cannot yield a fine pattern with a high resolution (hereinafter referred to as "low resolution") in most cases, whereas it can yield a desired pattern.

SUMMARY OF THE INVENTION

Specifically, the present invention provides, in an aspect, a composition of a positive photosensitive resin precursor (hereinafter briefly referred to as "resin composition" or "precursor composition"), including (a) a polyamic acid ester and/or a polyamic acid each having at least one of a carboxyl group, a phenolic hydroxyl group, a sulfonic acid group, a thiol group and combinations thereof at the end of a principal chain of the polymer, (b) a compound having a phenolic hydroxyl group and (c) a quinonediazide sulfonate.

In another aspect, the present invention provides a display device including a substrate, a first electrode formed on the substrate, an insulating layer formed on the first electrode in such a manner that part of the first electrode is exposed, and a second electrode facing the first electrode, in which the insulating layer includes the aforementioned resin composition.

The resin composition of the present invention can be developed in an alkaline aqueous solution, exhibits excellent resolution, sensitivity and film residual rate and can specifically advantageously used as an insulating layer of a display.

DESCRIPTION OF THE PREFERRED EMBODIMENTS

The present inventors have found that a resin composition containing a compound having a phenolic hydroxyl group and a naphthoquinonediazide compound in addition to a polyimide precursor is dissolved little in an alkali developer before exposure and is readily dissolved in the alkali developer after exposure, which polyimide precursor is synthetically obtained by using an endcapping agent having an alkali-soluble group. This resin composition exhibits less reduction in film thickness due to development, can be developed in a short time (hereinafter referred to as "high sensitivity") and can yield a fine pattern (hereinafter referred to as "high resolution"). The present invention has been accomplished based on these findings.

Polyamic acid esters for use in the present invention can become polymers each having an imide ring structure by heat or by catalysis of an appropriate catalyst. The resulting polymers each have an imide ring structure and have significantly improved heat resistance and solvent resistance.

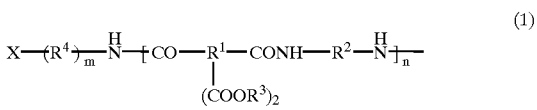

(1)

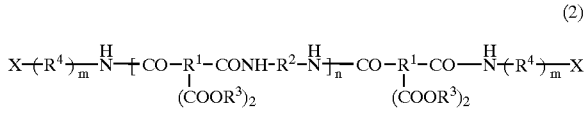

(2)

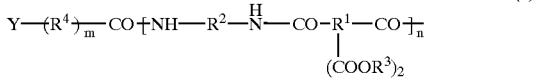

(3)

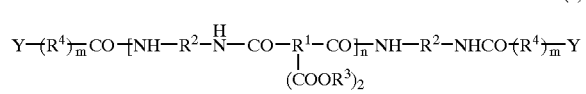

(4)

In Formulae (1), (2), (3) and (4), $R^1$ is an organic group having a valency of 4; $R^2$ is an organic group having a valency of from 2 to 4; $R^3$ is a hydrogen atom and/or an organic group having from 1 to 20 carbon atoms; $R^4$ is an organic group having a valency of 2; X is an organic group having at least one of a carboxyl group, a phenolic hydroxyl group, a sulfonic acid group and a thiol group and having a valency of from 2 to 8; n is an integer from 10 to 100000; and m is an integer from 0 to 10.

The component $R^1$ in Formulae (1), (2), (3) and (4) represents a structural component of a dianhydride. The dianhydride is preferably a tetravalent organic group having an aromatic ring or an aliphatic ring and having a valency of from 4, of which an organic group having from 5 to 40 carbon atoms is typically preferred.

Such dianhydrides include, but are not limited to, pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl) sulfone dianhydride, bis(3,4-dicarboxyphenyl) ether dianhydride, 1,2,5,6-naphthalenetetracarboxylic dianhydride, 2,3,6,7-naphthalenetetracarboxylic dianhydride, 2,3,5,6-pyridinetetracarboxylic dianhydride, 3,4,9,10- perylenetetracarboxylic dianhydride, 2,2-bis(3,4-dicarboxyphenyl)hexafluoropropane dianhydride, and other aromatic tetracarboxylic dianhydrides; and butanetetracarboxylic dianhydride, 1,2,3,4-cyclopentanetetracarboxylic dianhydride, and other aliphatic tetracarboxylic dianhydrides. Among them, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl) sulfone dianhydride, bis(3,4-dicarboxyphenyl) ether dianhydride, and 2,2-bis(3,4-dicarboxyphenyl)hexafluoropropane dianhydride are preferred. Each of these components can be used alone or in combination.

The component $R^2$ in Formulae (1), (2), (3) and (4) represents a structural component of a diamine. Such diamines are preferably organic groups each having an aromatic ring or an aliphatic ring and having a valency of from 2 to 4, of which organic groups each having from 5 to 40 carbon atoms are typically preferred.

Such diamines include, but are not limited to, 3,4'-diaminodiphenyl ether, 4,4'-diaminodiphenyl ether, 3,4'-diaminodiphenylmethane, 4,4'-diaminodiphenylmethane, 3,4'-diaminodiphenyl sulfone, 4,4'-diaminodiphenyl sulfone, 3,4'-diaminodiphenyl sulfide, 4,4'-diaminodiphenyl sulfide, 1,4-bis(4-aminophenoxy)benzene, benzidine, m-phenylenediamine, p-phenylenediamine, 1,5-naphthalenediamine, 2,6-naphthalenediamine, bis(4-aminophenoxyphenyl) sulfone, bis(3-aminophenoxyphenyl) sulfone, bis(4-aminophenoxy)biphenyl, bis{4-(4-aminophenoxy)phenyl}ether, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, compounds in which an alkyl group or a halogen atom is substituted on these aromatic rings, and other aromatic diamines; and cyclohexyldiamines, methylenebiscyclohexylamine, and other aliphatic diamines.

Among them, 3,4'-diaminodiphenyl ether, 4,4'-diaminodiphenyl ether, 3,4'-diaminodiphenylmethane, 4,4'-diaminodiphenylmethane, 3,4-diaminodiphenyl sulfone, 4,4'-diaminodiphenyl sulfone, 3,4'-diaminodiphenyl sulfide, 4,4'-diaminodiphenyl sulfide, m-phenylenediamine, p-phenylenediamine and 1,4-bis (4-aminophenoxy)benzene are preferred, of which 3,4'-diaminodiphenyl ether, 4,4'-diaminodiphenyl ether, 3,4'-diaminodiphenylmethane, 4,4'-diaminodiphenylmethane, 3,4'-diaminodiphenyl sulfone, 4,4'-diaminodiphenyl sulfone and 1,4-bis(4-aminophenoxy) benzene are typically preferred. Each of these components is used alone or in combination.

The substituent $R^3$ in Formulae (1), (2), (3) and (4) represents a hydrogen atom and/or an organic group having from 1 to 20 carbon atoms. As $R^3$, organic groups are preferred from the view point of the stability of the resulting positive photosensitive resin precursor solution, but hydrogen atoms are preferred from the view point of the solubility of the resulting resin precursor in an aqueous alkaline solution. The substituents $R^3$ S may be a hydrogen atom and an organic group in combination in the present invention. By controlling the ratio of the hydrogen atom to the organic group in $R^3$, the dissolution rate of the resulting resin precursor in an alkaline aqueous solution changes and thereby yields a composition of a positive photosensitive resin precursor having an appropriate dissolution rate. The hydrogen atom preferably occupies from 10% to 90% of the substituents $R^3$s. If the organic group as $R^3$ has more than 20 carbon atoms, the resulting resin becomes in soluble in an alkaline aqueous solution. Accordingly, $R^3$s more preferably comprise at least one hydrocarbon group having from 1 to 16 carbon atoms with the balance of hydrogen atoms.

The structural component —NH—$(R^4)_m$—X in Formulae (1) and (2) is preferably one represented by following Formula (8), and this component is derived from a primary monoamine serving as an endcapping agent. The substituent X is preferably an organic group having at least one of a carboxyl group, a phenolic hydroxyl group, a sulfonic acid group and a thiol group and having a valency of from 2 to 8 and is more preferably an organic group having at least one of a carboxyl group, a phenolic hydroxyl group and a thiol group and having a valency of from 2 to 8.

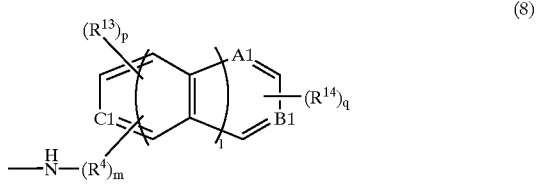

(8)

The structural component —CO—$(R^4)_m$—Y in Formulae (3) and (4) is preferably one of components represented by Formula (9) and (10), and these components are derived from one of anhydrides, monocarboxylic acids, mono(acid chloride) compounds and mono-active esters each serving as an endcapping agent. The substituent Y is preferably an organic group having at least one of a carboxyl group, a phenolic hydroxyl group, a sulfonic acid group and a thiol group and having a valency of from 2 to 8 and is more preferably an organic group having at least one of a carboxyl group, a phenolic hydroxyl group and a thiol group and having a valency of from 2 to 8. The components Ys in Formulae (3) and (4) comprise the endcapping group represented by Formula (9) alone, the endcapping group represented by Formula (10) alone, or both the endcapping groups represented by Formulae (9) and (10) in combination.

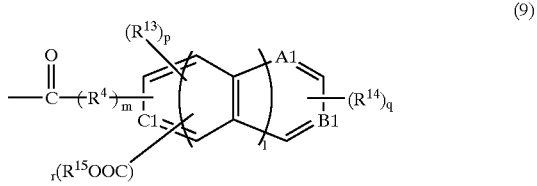

(9)

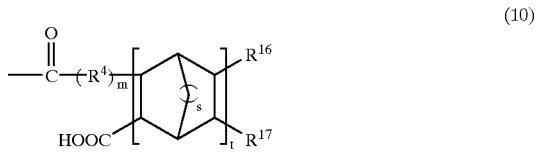

(10)

In Formulae (8), (9) and (10), $R^4$ is a divalent group selected from —$CR^{18}R^{19}$—, —$CH_2O$— and —$CH_2SO_2$—;

and $R^{18}$ and $R^{19}$ are each a monovalent group selected from a hydrogen atom, a hydroxyl group and hydrocarbon groups each having from 1 to 10 carbon atoms. The $R^{15}$ is a monovalent group selected from a hydrogen atom and a hydrocarbon group having from 1 to 10 carbon atoms and is preferably selected from a hydrogen atom and a hydrocarbon group having from 1 to 4 carbon atoms, of which a hydrogen atom, methyl group and t-butyl group are typically preferred. The substituents $R^{16}$ and $R^{17}$ are each a monovalent group selected from a hydrogen atom and hydrocarbon groups each having from 1 to 4 carbon atoms, or are directly combined with each other to form a ring structure such as a nadimide ring. The substituents $R^{13}$ and $R^{14}$ are each selected from a hydrogen atom, a hydroxyl group, a carboxyl group, a sulfonic acid group, a thiol group and a hydrocarbon group having from 1 to 10 carbon atoms, where at least one of $R^{13}$ and $R^{14}$ is a hydroxyl group, a carboxyl group, a sulfonic acid group or a thiol group. A1, B1 and C1 are the same or different and are each a carbon atom or a nitrogen atom. The repetition number m is an integer from 0 to 10 and is preferably an integer from 0 to 4. The number 1 is 0 or 1 and is preferably 0. The number p is 0 or 1 and is preferably 0. The repetition number q is an integer from 1 to 3 and is preferably 1 or 2. The numbers r, s and t are each 0 or 1.

Examples of primary monoamines corresponding to Formula (8) include 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, 3-amino-o-toluic acid, ammelide, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, and 4-aminothiophenol.

Among them, preferred are 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol and 4-aminothiophenol. Each of these components can be used alone or in combination.

Acid anhydrides, monocarboxylic acids, mono(acid chloride) compounds and mono-active esters corresponding to Formulae (9) and (10) include, but are not limited to, phthalic anhydride, maleic anhydride, nadic acid, cyclohexanedicarboxylic anhydride, 3-hydroxyphthalic anhydride, and other acid anhydrides; 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, and other monocarboxylic acids, and mono(acid chloride)s in which carboxyl groups of these monocarboxylic acids are converted into acid chlorides; mono(acid chloride) compounds, in which one carboxyl group alone of a dicarboxylic acid is converted into an acid chloride, derived from dicarboxylic acids such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, 2,7-dicarboxynaphthalene, and other dicarboxylic acids; and active esters obtained by the reaction between a mono(acid chloride) compound and N-hydroxybenzotriazole or N-hydroxy-5-norbornene-2,3-dicarboximide.

Among them, preferred are phthalic anhydride, maleic anhydride, nadic acid, cyclohexanedicarboxylic anhydride, 3-hydroxyphthalic anhydride, and other acid anhydrides; 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, 4-carboxybenzenesulfonic acid, and other monocarboxylic acids, and mono(acid chloride)s in which carboxyl groups of these monocarboxylic acids are converted into acid chlorides; mono(acid chloride) compounds in which one carboxyl group alone of a dicarboxylic acid is converted into an acid chloride, derived from dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, 2,6-dicarboxynaphthalene, and other dicarboxylic acids; and active esters obtained by the reaction between a mono(acid chloride) and N-hydroxybenzotriazole or N-hydroxy-5-norbornene-2,3-dicarboximide. Each of these components can be used alone or in combination.

The proportion of the component represented by Formula (8), i.e., —NH—$(R^4)_m$—X as the structural component in Formulae (1) and (2), is preferably from 0.1% to 60% by mole and more preferably from 5% to 50% by mole in terms of the primary monoamine component of the endcapping agent as the source component, relative to the total amine components.

The proportion of the component represented by Formula (9) or (10), i.e., —CO—$(R^4)_m$—Y as the structural component in Formulae (3) and (4), is preferably from 0.1% to 60% by mole and more preferably from 5% to 55% by mole in terms of the acid anhydride, monocarboxylic acid, mono (acid chloride) compound or mono-active ester compound component of the endcapping agent as the source component, relative to the total diamine components.

In Formulae (1), (2), (3) and (4), n is a repeating number of the structural repeating unit of the polymer component (a) according to the present invention and is preferably from 10 to 100000.

To improve adhesion to substrates, an aliphatic group having a siloxane structure can be copolymerized with $R^1$ and/or $R^2$ within a range not deteriorating heat resistance. Examples of such polymers include copolymers each comprising 1% to 10% by mole of bis(3-aminopropyl) tetramethyldisiloxane or bis(p-amino-phenyl) octamethylpentasiloxane as the diamine component.

The component (a) of the resin composition of the present invention may comprise the structural units represented by Formula (1) and/or (2) or those represented by Formula (3) and/or (4) alone or may be copolymers or blends with other structural units. In this case, the resulting polymer include equal to or more than 50% by mole of the structural unit(s) represented by Formula (1) and/or (2) or those represented by Formula (3) and/or (4). The types and amounts of structural units for use in copolymerization or blending are preferably selected within ranges not deteriorating heat resistance of the resulting polyimide polymer ultimately obtained by heat treatment.

The heat-resistant resin precursor (a) according to the present invention is synthetically obtained in a conventional manner by replacing part of a diamine with a monoamine serving as an endcapping agent or by replacing a dianhydride with a monocarboxylic acid, acid anhydride, mono (acid chloride) or mono-active ester compound serving as the endcapping agent. For example, the heat-resistant resin precursor (a) can be obtained by a process in which a tetracarboxylic dianhydride is allowed to react with a diamine compound (part of which is substituted with a monoamine serving as the endcapping agent) at low temperatures; a process in which a tetracarboxylic dianhydride (part of which is replaced with a mono(acid chloride) compound or mono-active ester compound serving as the endcapping agent) is allowed to react with a diamine compound at low temperatures; a process in which a tetracarboxylic dianhydride is allowed to react with an alcohol to yield a diester, and the diester is allowed to react with a diamine (part of which is replaced with a monoamine serving as the endcapping agent) in the presence of a condensing agent; or a process in which a tetracarboxylic dianhydride is allowed to react with an alcohol to yield a diester, the remainder dicarboxylic acid is converted into an acid chloride, and the acid chloride is allowed to react with a diamine (part of which is replaced with a monoamine serving as the endcapping agent).

The endcapping agent introduced into the polymer (a) for use in the present invention can easily be detected by the following techniques. For example, the endcapping agent can easily be detected by dissolving the polymer having the introduced endcapping agent in an acidic solution and thereby decomposing the same into an amine component and an anhydride component as structural units of the polymer, and analyzing these components by means of gas chromatography (GC) or nuclear magnetic resonance (NMR). Alternatively, the endcapping agent can easily be detected by directly subjecting the polymer component having the introduced endcapping agent to pyrolysis gas chromatography (PGC) or determination of an infrared spectrum and $^{13}$C-NMR spectrum.

Compounds each having a phenolic hydroxyl group for use in the present invention include, but are not limited to, those available as Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (TetrakisP-DO-BPA), TrisP-HAP, TrisP-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, Methylenetris-FR-CR, BisRS-26X and BisRS-OCHP (trade names, available from Honshu Chemical Industry Co., Ltd.), BIR-OC, BIP-BIOC-F and TEP-BIP-A (trade names, available from Asahi Organic Chemicals Industry Co., Ltd.).

The compounds each having a phenolic hydroxyl group are preferably compounds represented by following Formula (5):

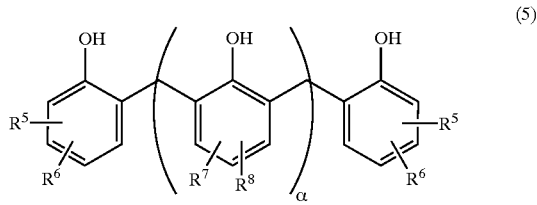

(5)

wherein $R^5$ to $R^8$ are each a hydrogen atom, a hydroxyl group, an alkyl group having from 1 to 20 carbon atoms or an alicyclic group having from 4 to 20 carbon atoms; and a is an integer from 0 to 5. Preferably, $R^7$ and $R^8$ are preferably each an alicyclic group having from 4 to 20 carbon atoms.

Such compounds represented by Formula (5) are available, for example, as BisPC-PCHP, BisRS-PEP, BisTBC-PC, Bis24X-PC, Bis35X-PC, Methylenebis-p-CR, o,o'-BPF, oo-BisOC-F, oo-Bis25X-F, MB-PIPP, BisMHQ-F and Bis24X-F (trade names, available from Honshu Chemical Industry Co., Ltd.), BIHQ-PC, BI2MR-PC, BI4MC-PC, BIR-34X, BIR-PAP, BIPC-PC, BIR-PC, BIR-PTBP, BIR-PCHP, 4PC and BIR-BIPC-F (trade names, available from Asahi Organic Chemicals Industry Co., Ltd.).

Alternatively, the compounds each having a phenolic hydroxyl group are preferably thermally cross-linkable compounds each having an organic group represented by Formula (6):

—CH$_2$—OR$^9$         (6)

wherein R$^9$ is a hydrogen atom, an alkyl group having from 1 to 20 carbon atoms, an alicyclic group having from 4 to 20 carbon atoms, or an R$^{10}$CO group, where R$^{10}$ is an alkyl group having from 1 to 20 carbon atoms. The substituent R$^9$ is preferably an alkyl group having from 1 to 20 carbon atoms or an alicyclic group having from 4 to 20 carbon atoms.

Such thermally cross-linkable compounds each having one group represented by Formula (6) are available as ML-26X, ML-24X, ML-236TMP, 4-Methylol3M6C, ML-TC and ML-TBC (trade names, available from Honshu Chemical Industry Co., Ltd.). Those each having two groups represented by Formula (6) are available as DM-BI25X-F (trade name, available from Asahi Organic Chemicals Industry Co., Ltd.), DML-MBPC, DML-MBOC, Dimethylol-Bis-C, Dimethylol-BisOC-P, DML-BisOC-Z, DML-BisOCHP-Z, DML-MB25, DML-MTrisPC, DML-Bis25X-34XL and DML-Bis25X-PCHP (trade names, available from Honshu Chemical Industry Co., Ltd.); those each having three organic groups represented by Formula (6) are available as, for example, TriML-P, TriML-35XL and TriML-TrisCR-HAP (trade names, available from Honshu Chemical Industry Co., Ltd.); those having four organic groups represented by Formula (6) are available as, for example, TM-BIP-A (trade name, available from Asahi Organic Chemicals Industry Co., Ltd.), TML-BP, TML-HQ, TML-pp-BPF, TML-BPA and TMOM-BP (trade names, available from Honshu Chemical Industry Co., Ltd.); those each having six organic groups represented by Formula (6) are available as, for example, HML-TPPHBA and HML-TPHAP (trade names, available from Honshu Chemical Industry Co., Ltd.).

The thermally cross-linkable compounds each having the organic group represented by Formula (6) are preferably compounds represented by following Formula (7):

(7)

wherein R$^9$ has the same meaning as defined above; and R$^{11}$ and R$^{12}$ are each a hydrogen atom, an alkyl group having from 1 to 20 carbon atoms, an alicyclic group having from 4 to 20 carbon atoms or an R$^{13'}$COO group, where R$^{13'}$ is an alkyl group having from 1 to 20 carbon atoms.

Such compounds represented by Formula (7) each having two organic groups represented by Formula (6) include, for example, 46DMOC, 46DMOIPP, 46DMOEP and 46DMO-CHP (trade names, available from Asahi Organic Chemicals Industry Co., Ltd.), DML-OCHP, DML-PC, DML-PCHP, DML-PTBP, DML-34X, DML-EP, DML-POP, DML-OC, DML-PFP and DML-PSBP (trade names, available from Honshu Chemical Industry Co., Ltd.), 2,6-dimethoxymethyl-4-t-butylphenol, 2,6-dimethoxymethyl-p-cresol and 2,6-diacetoxymethyl-p-cresol.

Of these compounds each having a phenolic hydroxyl group, preferred compounds are Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, Methylenetris-FR-CR, and BisRS-26X; the compounds represented by Formula (5) such as BisPC-PCHP, BisTBC-PC, Bis35X-PC, Methylenebis-p-CR, o,o'-BPF, MB-PIPP, BisMHQ-F and Bis24X-F (trade names, available from Honshu Chemical Industry Co., Ltd.), BI2MR-PC, BI4MC-PC, BIR-PAP, BIPC-PC, BIR-PC, BIR-PTBP, BIR-PCHP, 4PC and BIR-BIPC-F (trade names, available from Asahi Organic Chemicals Industry Co., Ltd.); the thermally cross-linkable compounds each having two organic groups represented by Formula (6) such as DML-MBPC, DML-MBOC, Dimethylol-BisOC-P, DML-MTrisPC, and the compounds represented by Formula (7) such as 46DMOC, 46DMOEP, 46DMOCHP, DML-OCHP, DML-PC, DML-PCHP, DML-PTBP, DML-34X, DML-EP, DML-POP, DML-PFP, DML-PSBP, 2,6-dimethoxymethyl-4-t-butylphenol, 2,6-dimethoxymethyl-p-cresol and 2,6-diacetoxymethyl-p-cresol; the thermally cross-linkable compounds each having three organic groups represented by Formula (6) such as TriML-P and TriML-35XL; those each having four organic groups represented by Formula (6) such as TM-BIP-A, TML-BP, TML-HQ, TML-pp-BPF, TML-BPA and TMOM-BP; and those each having six organic groups represented by Formula (6) such as HML-TPPHBA and HML-TPHAP.

Among them, typically preferred compounds are Bis-Z, TekP-4HBPA, TrisP-HAP and TrisP-PA; the compounds represented by Formula (5) such as BisPC-PCHP, BisTBC-PC, BI2MR-PC, BI4MC-PC, BIR-PAP, BIPC-PC, BIR-PC, BIR-PTBP, BIR-PCHP, 4PC, BIR-BIPC-F; the thermally cross-linkable compounds each having two organic groups represented by Formula (6) such as DML-MBPC and DML-MBOC, and the compounds represented by Formula (7) such as DML-OCHP, DML-PC, DML-PCHP, DML-PTBP, DML-POP, 2,6-dimethoxymethyl-4-t-butylphenol, 2,6-dimethoxymethyl-p-cresol and 2,6-diacetoxymethyl-p-cresol.

More preferred compounds are the compounds represented by Formula (5) such as BisPC-PCHP, BIR-PCHP and BIPC-PC; and the compounds represented by Formula (7) such as DML-OCHP, DML-PC, DML-PCHP, DML-PTBP, DML-POP, 2,6-dimethoxymethyl-4-t-butylphenol, 2,6-dimethoxymethyl-p-cresol and 2,6-diacetoxymethyl-p-cresol.

Bis-Z

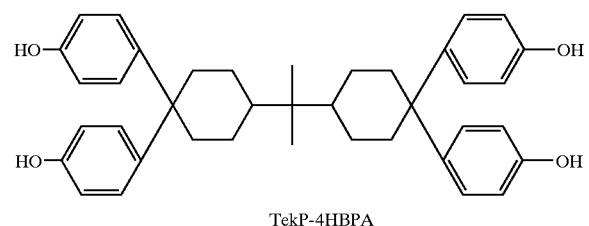

TekP-4HBPA

-continued
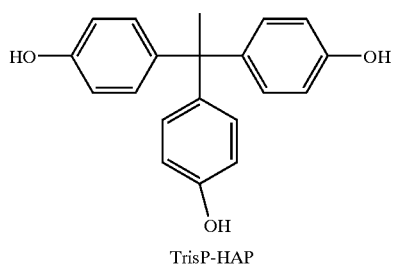
TrisP-HAP
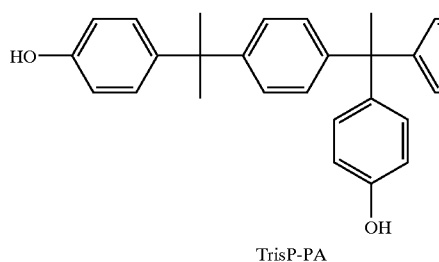
TrisP-PA
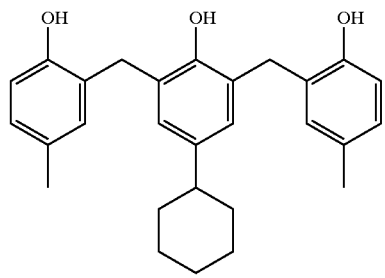
BisPC-PCHP
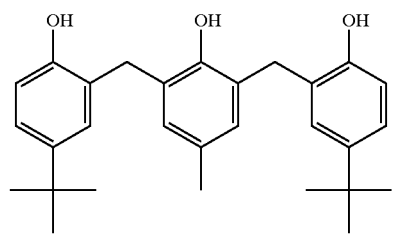
BisTBC-PC
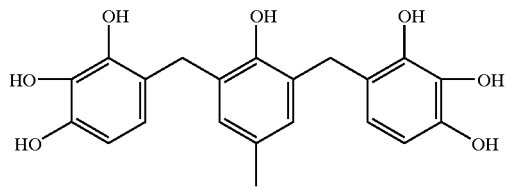
BI2MR-PC
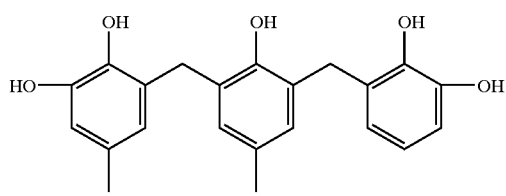
BI4MC-PC
-continued
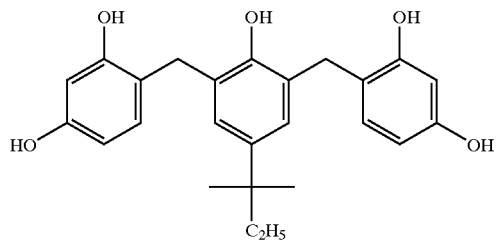
BIR-PAP
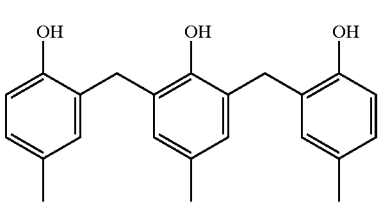
BIPC-PC
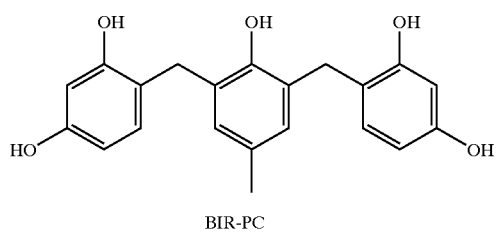
BIR-PC
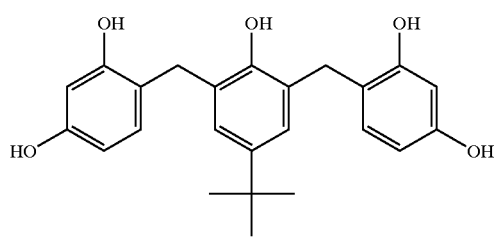
BIR-PTBP
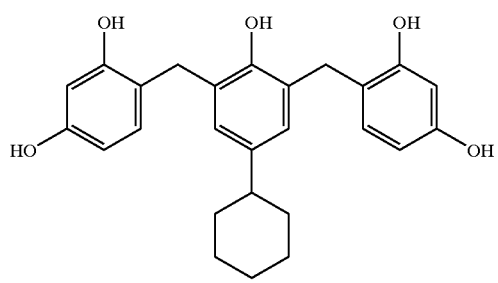
BIR-PCHP
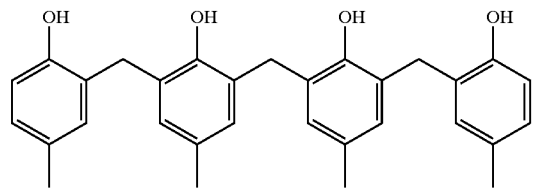
4PC -continued

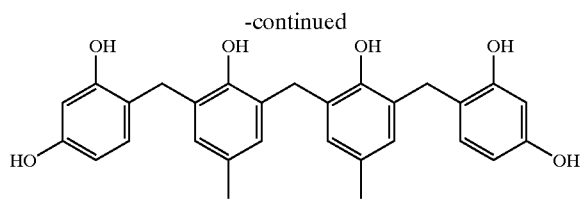

BIR-BIPC-F

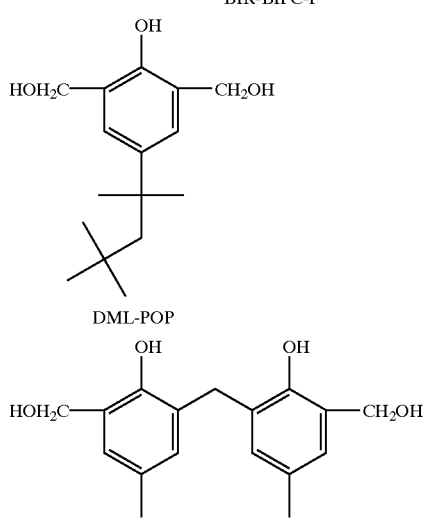

DML-POP

DML-MBPC

DML-MBOC

DML-OCHP

DML-PCHP

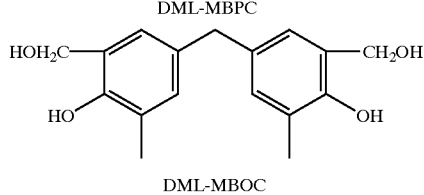

DML-PC

-continued

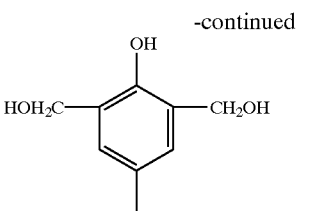

DML-PTBP 2,6-dimethoxymethyl-4-t-butylphenol 2,6-dimethoxymethyl-p-cresol 2,6-diacetoxymethyl-p-cresol By adding the compound (b) having a phenolic hydroxyl group, the resulting resin composition dissolves little in an alkaline developer before exposure, becomes readily soluble in the alkaline developer by action of exposure and thereby can easily be developed in a short time with less reduction in film thickness due to development.

The amount of the compound (b) having a phenolic hydroxyl group is preferably from 1 to 50 parts by weight, and more preferably from 3 to 40 parts by weight, relative to 100 parts by weight of the polymer component (a). Each of these compounds (b) having a phenolic hydroxyl group can be used alone or in combination.

Quinonediazide sulfonates (c) for use in the present invention are preferably compounds in which a naphthoquinonediazidosulfonic acid is bonded through an ester bond to a compound having a phenolic hydroxyl group. The compound having a phenolic hydroxyl group for use herein may be the same with, or different from, the compound (b) having a phenolic hydroxyl group. Preferred quinonediazide sulfonates (c) are compounds in which 4-naphthoquinonediazidosulfonic acid or 5-naphthoquinonediazidosulfonic acid is bonded through an ester bond to a compound such as Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, Methylenetris-FR-CR and BisRS-26X (trade names, available from Honshu Chemical Industry Co., Ltd.), BIR-OC, BIP-PC, BIR-PC, BIR-PTBP, BIR- PCHP, BIP-BIOC-F, 4PC, BIR-BIPC-F and TEP-BIP-A (trade names, available from Asahi Organic Chemicals Industry Co., Ltd.), naphthol, tetrahydroxybenzophenone, methyl gallate, bisphenol A, methylenebisphenol or BisP-AP (trade name, available from Honshu Chemical Industry Co., Ltd.). Naturally, other quinonediazide sulfonates can be used in the present invention. Each of these quinonediazide sulfonates (c) can be used alone or in combination.

If the quinonediazide sulfonate (c) has a molecular weight of more than 1000, the quinonediazide sulfonate (c) cannot significantly be decomposed in a subsequent heat treatment, and thereby the resulting film of the resin composition may have deteriorated heat resistance, mechanical characteristics or adhesion. From this viewpoint, the molecular weight of the quinonediazide sulfonate (c) is preferably from 300 to 1000 and more preferably from 350 to 800. The amount of the quinonediazide sulfonate (c) is preferably from 1 to 50 parts by weight relative to 100 parts by weight of the polymer component (a).

The resin composition may further comprise various additives according to necessity within ranges not deteriorating the advantages of the invention. For example, in order to improve wettability between the photosensitive heat-resistant resin precursor composition and a substrate, the resin composition may comprise surfactants; ethyl lactate, propylene glycol monomethyl ether acetate, and other esters; ethanol and other alcohols; cyclohexanone, methyl isobutyl ketone, and other ketones; tetrahydrofuran, dioxane, and other ethers. In addition, silicon dioxide particles, titanium dioxide particles, and other inorganic particles or polyimide powders can be added to the resin composition.

To improve adhesion between the film of the resin composition and a substrate such as a silicon wafer, 0.5% to 10% by weight of a silane coupling agent, a titanium chelating agent or another additive can be added to the varnish of the resin composition. Alternatively, the substrate may be pretreated with a solution of the additive.

In the former case, methyl methacryloxydimethoxysilane, 3-aminopropyltrimethoxysilane or another coupling agent, a titanium-chelating agent or an aluminum-chelating agent is added to the varnish in a proportion of from 0.5% to 10% by weight relative to the weight of the polymer component (a) in the varnish.

In the latter case, 0.5% to 20% by weight of the coupling agent is dissolved in a solvent, and the resulting solution is applied to the surface of the substrate by means of spin coating, dipping, spraying or steaming. In some cases, the substrate is heated at temperatures of 50° C. to 300° C. to accelerate the reaction between the substrate and the coupling agent. Such solvents for use herein include, for example, isopropyl alcohol, ethanol, methanol, water, tetrahydrofuran, propylene glycol monomethyl ether acetate, propylene glycol monomethyl ether, ethyl lactate, and diethyl adipate.

The resin composition of the present invention can yield a patterned heat-resistant resin, for example, in the following manner.

Initially, the resin composition is applied onto a substrate. Such substrates include, but are not limited to, silicon wafers, ceramics, gallium arsenide (GaAs), soda glass and quartz glass. The resin composition is applied to the substrate by spin coating using a spinner, spray coating, roll coating or another technique. The thickness of the applied film is generally set so that the thickness after drying falls within a range from 0.1 to 10 μm, depending on the coating technique, the solid concentration and viscosity of the resin composition and other factors.

Next, the substrate carrying the resin composition is dried to yield a film of the resin composition. The drying operation is preferably performed using an oven, hot plate or infrared rays at temperatures of from 50° C. to 180° C. for 1 minute to several hours.

The film of the resin composition is then irradiated with and exposed to actinic radiation through a desirably patterned mask. Such actinic radiation for exposure includes ultraviolet rays, visible light, electron beams, and X rays. Among them, i-line (365 nm), h-line (405 nm) or g-line (436 nm) from a mercury lamp is preferably used in the present invention.

To pattern the heat-resistant resin, exposed portions of the resin film are removed by using a developer. As the developer, an aqueous solution of a compound exhibiting alkalinity is preferred. Such compounds exhibiting alkalinity include, for example, tetramethyl ammonium, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine and hexamethylenediamine. According to necessity, additional components can be added to the aqueous solution. Such additional components include, for example, N-methyl-2-pyrrolidone, N,N-dimethylformamide, N,N-dimethylacetamide, dimethyl sulfoxide, gamma-butyrolactone, dimethylacrylamide, and other polar solvents; methanol, ethanol, isopropyl alcohol, and other alcohols; ethyl lactate, propylene glycol monomethyl ether acetate, and other esters; cyclopentanone, cyclohexanone, isobutyl ketone, methyl isobutyl ketone, and other ketones. Each of these additional components can be used alone or in combination. After developing, the film is rinsed with water. The water for rinsing may further comprise ethanol, isopropyl alcohol, and other alcohols; ethyl lactate, propylene glycol monomethyl ether acetate, and other esters.

After developing, the film is heated at temperatures of from 180° C. to 500° C. and is thereby converted into a heat-resistant resin film. In this procedure, the film is heated for 5 minutes to 5 hours by selecting a temperature and elevating the temperature in stages or by selecting a temperature range and continuously elevating the temperature. For example, the film is heated at 130° C., 200° C. and then 350° C. for each 30 minutes, respectively, or the temperature is linearly elevated from room temperature to 250° C. over 2 hours or from room temperature to 400° C. over 2 hours.

The heat-resistant resin film prepared by using the resin composition of the present invention can be used as a passivation film of a semiconductor, a protective film of a semiconductor device, an insulating layer in a display device carrying an organic electroluminescent device.

The insulating layer formed by using the resin composition of the present invention is used in a display device comprising a substrate, a first electrode formed on the substrate, and a second electrode facing the first electrode. Specifically, such display devices include, for example, liquid crystal displays (LCDs), electrochromic displays (ECDs), electroluminescent displays (ELDs) and display devices using organic electroluminescent devices (organic electroluminescent units). The organic electroluminescent unit is a display device comprising an organic electroluminescent device including a substrate, a first electrode formed on the substrate, a thin film layer containing at least a luminescent layer composed of an organic compound, and a second electrode formed on the thin film layer.

The present invention will be illustrated in further detail with reference to several examples and comparative examples below, which are not intended to limit the scope of the invention. The characteristics of resin compositions obtained in the examples and comparative examples were evaluated by the following methods.

Preparation of Photosensitive Polyimide Precursor Film

A sample photosensitive heat-resistant resin composition (hereinafter referred to as "varnish") was applied onto a 6-inch silicon wafer, so that the film after prebaking had a thickness of 1.5 μm, and was prebaked at 120° C. for 3 minutes using a hot plate (available from DAINIPPON SCREEN MFG. CO., LTD. under the trade name of "SCW-636") and thereby yielded a film of a photosensitive polyimide precursor.

Measuring Method of Film Thickness

The thickness of the sample film was determined at a refractive index of 1.64 using a film thickness measurement system (available from DAINIPPON SCREEN MFG. CO., LTD., under the trade name of "Lambda Ace STM-602").

Exposure

A Nikon test pattern (available from Nikon Corporation, Japan) was set to an exposure system (available from Canon Inc., Japan under the trade name of "Contact Aligner PLA 501F"), and the sample film was exposed to total ultraviolet rays at an irradiance of 10 mW/cm$^2$ (in terms of 365 nm) for a predetermined time.

Development

The sample film was developed by immersing the same in a developer, a 2.38% aqueous solution of tetramethylammonium hydroxide, at 23° C. for 60 seconds, was then rinsed with water for 20 seconds and was dried.

Calculation of Film Residual Rate

The film residual rate was calculated according to the, following equation:

Film residual rate (%)=[(Film thickness after development)/(Film thickness after prebaking)]×100

Calculation of Sensitivity

The sensitivity of the sample film after exposure and development was defined as the exposure (hereinafter briefly referred to as "optimum exposure") to reproduce a 50-μm line-and-space pattern (1L/1S) with a line-and-space width of 1:1.

Calculation of Resolution

The resolution of the sample film after exposure and development was defined as the minimum pattern size to reproduce a 50-μm line-and-space pattern (1L/1S) with a line-and-space width of 1:1 at the optimum exposure.

PREPARATION EXAMPLE 1

Preparation of Active Ester (a)

Under flow of dried nitrogen gas, 18.5 g (0.1 mole) of 4-carboxybenzoyl chloride and 13.5 g (0.1 mole) of hydroxybenzotriazole were dissolved in 100 g of tetrahydrofuran (THF), and the resulting solution was cooled to −15° C. To the cooled solution, a solution containing 10.0 g (0.1 mole) of triethylamine in 50 g of THF was added dropwise so that the temperature of the resulting reaction mixture did not exceed 0° C. After the completion of addition, the mixture was allowed to react at 25° C. for 4 hours. The resulting reaction mixture was concentrated using a rotatory evaporator and thereby yielded an active ester (a).

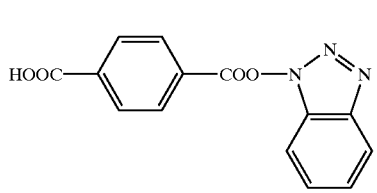

(a)

PREPARATION EXAMPLE 2

Preparation of Solution (b) of Diethyl Pyromellitate Dichloride

Under flow of dried nitrogen gas, 17.4 g (0.08 mole) of pyromellitic dianhydride and 36.9 g (0.8 mole) of ethanol were allowed to react at 95° C. for 6 hours with stirring. Excessive ethanol was removed by distillation under a reduced pressure, and thereby diethyl pyromellitate was obtained. To thus-obtained diethyl pyromellitate, 95.17 g (0.8 mole) of thionyl chloride and 70 g of tetrahydrofuran (THF) were added and were allowed to react at 40° C. for 3 hours. Subsequently, 200 g of N-methyl-2-pyrrolidone was added to the resulting mixture, excessive thionyl chloride and THF were removed under a reduced pressure and thereby yielded 227.8 g (0.08 mole) of a solution of diethyl pyromellitate dichloride.

PREPARATION EXAMPLE 3

Preparation of Solution (c) of Diethyl 3,3'4,4'-Benzophenonetetracarboxylate Dichloride Under flow of dried nitrogen gas, 25.78 g (0.08 mole) of 3,3',4,4'-benzophenonetetracarboxylic dianhydride and 36.90 g (0.8 mole) of ethanol were allowed to react at 95° C. for 6 hours with stirring. Excessive ethanol was removed by distillation under a reduced pressure, and thereby diethyl 3,3',4,4'-benzophenonetetracarboxylate was obtained. To thus-obtained diethyl 3,3',4,4'-benzophenonetetracarboxylate, 95.17 g (0.8 mole) of thionyl chloride and 70 g of tetrahydrofuran (THF) were added and were allowed to react at 40° C. for 3 hours. Subsequently, 200 g of N-methyl-2-pyrrolidone was added to the resulting mixture, excessive thionyl chloride and THF were removed under a reduced pressure and thereby yielded 233.15 g (0.08 mole) of a solution of diethyl 3,3',4,4'-benzophenonetetracarboxylate dichloride.

PREPARATION EXAMPLE 4

Preparation of Quinonediazide Sulfonate (1)

Under flow of dried nitrogen gas, 21.23 g (0.05 mole) of TrisP-HAP (trade name, available from Honshu Chemical Industry Co., Ltd.) and 33.58 g (0.125 mole) of 5-naphthoquinonediazidosulfonyl chloride were dissolved in 450 g of 1,4-dioxane, and the resulting solution was held at room temperature. To the solution, a mixture of 50 g of 1,4-dioxane and 12.65 g (0.125 mole) of triethylamine was added dropwise so that the temperature of the reaction system did not become 35° C. or higher. After the completion of addition, the resulting mixture was stirred at 30° C. for 2 hours. Produced triethylamine salts were removed by filtration, and the filtrate was put into water. The resulting precipitate was then collected by filtration, was dried in a vacuum drier and thereby yielded the following quinonediazide sulfonate (1).

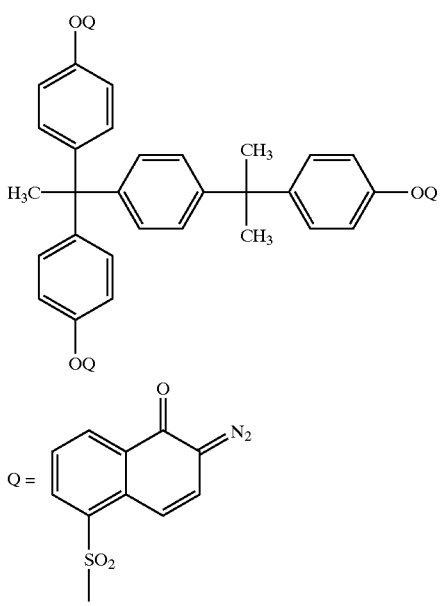

PREPARATION EXAMPLE 5

Preparation of Quinonediazide Sulfonate (2)

Under flow of dried nitrogen gas, 15.31 g (0.05 mole) of TrisP-HAP (trade name, available from Honshu Chemical Industry Co., Ltd.) and 40.28 g (0.15 mole) of 5-naphthoquinonediazidosulfonyl chloride were dissolved in 450 g of 1,4-dioxane, and the resulting solution was held at room temperature. Using the solution and a mixture containing 50 g of 1,4-dioxane and 15.18 g (0.15 mole) of triethylamine, a reaction was performed in the same manner as in Preparation Example 4 and thereby yielded the following quinonediazide sulfonate (2).

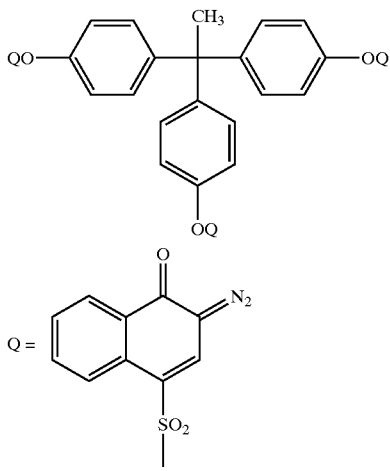

PREPARATION EXAMPLE 6

Preparation of Quinonediazide Sulfonate (3)

Under flow of dried nitrogen gas, 6.81 g (0.05 mole) of 4-isopropylphenol and 13.43 g (0.05 mole) of 5-naphthoquinonediazidosulfonyl chloride were dissolved in 450 g of 1,4-dioxane, and the resulting solution was held at room temperature. Using the solution and a mixture containing 50 g of 1,4-dioxane and 5.06 g of triethylamine, a reaction was performed in the same manner as in Preparation Example 4 and thereby yielded the following quinonediazide sulfonate (3).

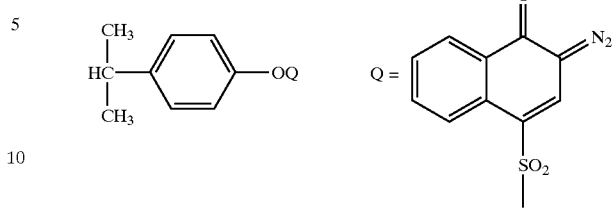

PREPARATION EXAMPLE 7

Preparation of Quinonediazide Sulfonate (4)

Under flow of dried nitrogen gas, 11.41 g (0.05 mole) of bisphenol A and 26.86 g (0.1 mole) of 5-naphthoquinonediazidosulfonyl chloride were dissolved in 450 g of 1,4-dioxane, and the resulting solution was held at room temperature. Using the solution and a mixture containing 50 g of 1,4-dioxane and 10.12 g of triethylamine, a reaction was performed in the same manner as in Preparation Example 4 and thereby yielded the following quinonediazide sulfonate (4).

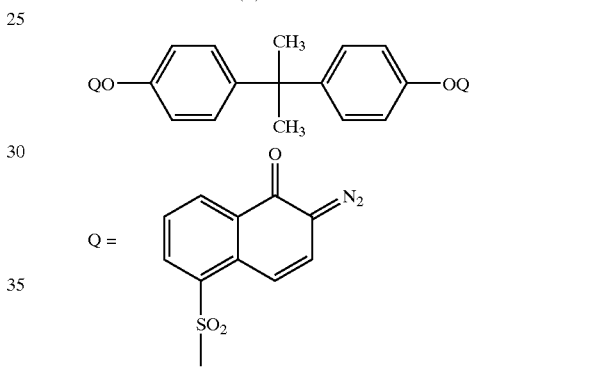

The other compounds each having a phenolic hydroxyl group used in the examples and comparative examples are shown below.

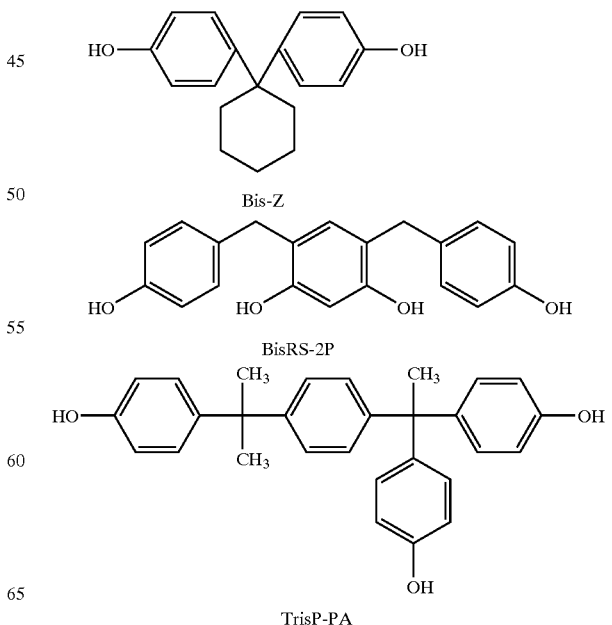

-continued

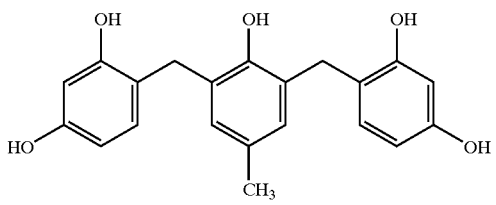
BIR-PC

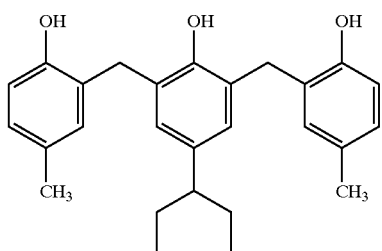
BisPC-PCHP

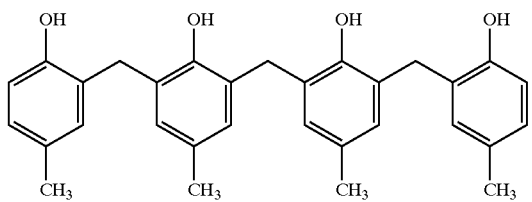
4PC

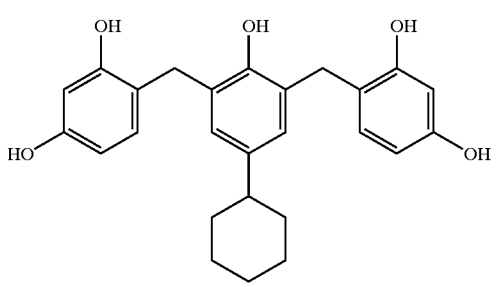
BIR-PCHP

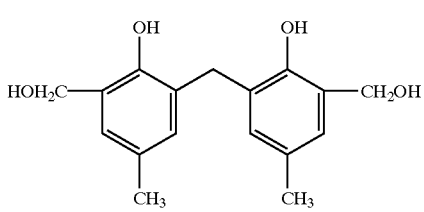
DML-MBPC

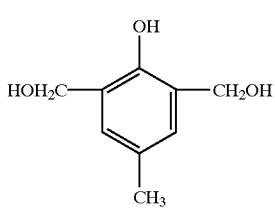
DML-PC

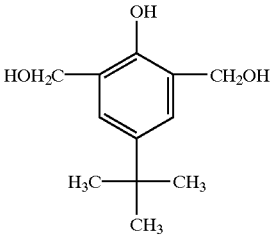
DML-PTBP

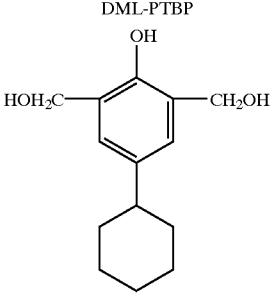
DML-PCHP

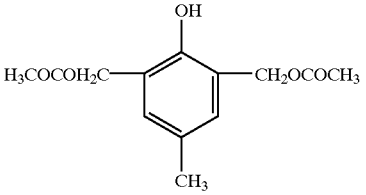
2,6-diacetoxymethyl-p-cresol

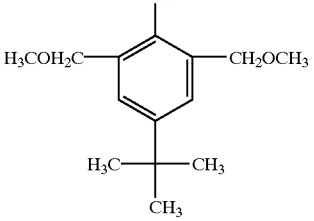
2,6-dimethoxymethyl-4-t-butylphenol

EXAMPLE 1

Under flow of dried nitrogen gas, 10.89 g (0.054 mole) of 4,4'-diaminodiphenyl ether, 1.86 g (0.007 mole) of 1,3-bis(3-aminopropyl)tetramethyldisiloxane and 2.05 g (0.019 mole) of 3-aminophenol (available from Tokyo Chemical Industry Co., Ltd.) as the endcapping agent were dissolved in 20 g of N-methyl-2-pyrrolidone (NMP). To the resulting solution, 23.27 g (0.075 mole) of bis(3,4-dicarboxyphenyl) ether dianhydride and 15 g of NMP were added, the resulting mixture was allowed to react at 20° C. for 1 hour and subsequently at 50° C. for 4 hours. To the reaction mixture, a solution containing 15.19 g (0.127 mole) of N,N-dimethylformamide dimethyl acetal in 4 g of NMP was added dropwise over 10 minutes. After the completion of addition, the mixture was stirred at 50° C. for 3 hours. Subsequently, 123.9 g of NMP was added to the mixture and thereby yielded a polymer solution A.

To the above-prepared polymer solution A, 7 g of the quinonediazide sulfonate (1) and 4 g of Bis-Z (trade name, available from Honshu Chemical Industry Co., Ltd.) as the compound having a phenolic hydroxyl group were added and thereby yielded a varnish A of a photosensitive polyimide precursor composition. Using the obtained varnish A, a film of the photosensitive polyimide precursor was formed on a silicon wafer, was exposed and developed, and the sensitivity, film residual rate and resolution of the varnish were evaluated in the same manner as above.

EXAMPLE 2

Under flow of dried nitrogen gas, 10.14 g (0.051 mole) of 4,4'-diaminodiphenyl ether, 1.86 g (0.007 mole) of 1,3-bis (3-aminopropyl)tetramethyldisiloxane, 6.31 g (0.034 mole) of 1-carboxy-5-aminonaphthalene (available from Tokyo Chemical Industry Co., Ltd.) as the endcapping agent and 11.93 g (0.151 mole) of pyridine were dissolved in 50 g of N-methyl-2-pyrrolidone (NMP). To the resulting solution, 216.8 g (0.076 mole) of the solution (b) of diethyl pyromellitate dichloride was added dropwise so that the temperature of the reaction system did not become 10° C. or higher. After the completion of addition, the mixture was stirred at room temperature for 6 hours. After the completion of reaction, the reaction mixture was put into 2 liters of water, and the precipitate of a solid polymer was collected by filtration. The solid polymer was then dried at 80° C. in a vacuum drier for 20 hours and thereby yielded a solid polymer B.

In 70 g of gamma-butyrolactone, 10 g of the above-prepared solid polymer B, 2.9 g of the quinonediazide sulfonate (2), 2.4 g of BisRS-2P (trade name, available from Honshu Chemical Industry Co., Ltd.) as the compound having a phenolic hydroxyl group and 0.3 g of vinyltrimethoxysilane were dissolved and thereby yielded a varnish B of a photosensitive polyimide precursor composition. Using the prepared varnish B, a film of the photosensitive polyimide precursor was formed on a silicon wafer, was exposed and developed, and the sensitivity, film residual rate and resolution of the varnish were evaluated in the same manner as above.

EXAMPLE 3

Under flow of dried nitrogen gas, 12.42 g (0.016 mole) of 4,4'-diaminodiphenyl sulfone, 1.39 g (0.0056 mole) of 1,3-bis(3-aminopropyl)tetramethyldisiloxane, 5.38 g (0.019 mole) of the above-prepared active ester (a) as the endcapping agent and 7.03 g (0.089 mole) of pyridine were dissolved in 50 g of N-methyl-2-pyrrolidone (NMP) and were allowed to react at room temperature for 2 hours. To the resulting solution, 128.2 g (0.044 mole) of the solution (c) of diethyl 3,3',4,4'-benzophenonetetracarboxylate dichloride was added dropwise so that the temperature of the reaction system did not become 10° C. or higher. After the completion of addition, the mixture was stirred at room temperature for 6 hours. After the completion of reaction, the reaction mixture was put into 2 liters of water, and the precipitate of a solid polymer was collected by filtration. The solid polymer was then dried at 80° C. in a vacuum drier for 20 hours and thereby yielded a solid polymer C.

In 70 g of N-methyl-2-pyrrolidone, 10 g of the above-prepared solid polymer C, 1.7 g of the quinonediazide sulfonate (3), 1.7 g of TrisP-PA (trade name, available from Honshu Chemical Industry Co., Ltd.) as the compound having a phenolic hydroxyl group were dissolved and thereby yielded a varnish C of a photosensitive polyimide precursor composition. Using the prepared varnish C, a film of the photosensitive polyimide precursor was formed on a silicon wafer, was exposed and developed, and the sensitivity, film residual rate and resolution of the varnish were evaluated in the same manner as above.

EXAMPLE 4

Under flow of dried nitrogen gas, 9.91 g (0.056 mole) of 4,4'-diaminodiphenylmethane, 1.39 g (0.0056 mole) of 1,3-bis(3-aminopropyl)tetramethyldisiloxane and 3.12 g (0.019 mole) of 3-hydroxyphthalic anhydride (available from Tokyo Chemical Industry Co., Ltd.) as the endcapping agent were dissolved in 50 g of N-methyl-2-pyrrolidone (NMP). To the resulting solution, 13.65 g (0.044 mole) of bis(3,4-dicarboxyphenyl) ether dianhydride and 14 g of NMP were added and were allowed to react at 20° C. for 1 hour and subsequently at 50° C. for 4 hours. To the resulting reaction mixture, a solution of 16.09 g (0.135 mole) of N,N-dimethylformamide dimethyl acetal in 5 g of NMP was added dropwise over 10 minutes. After the completion of addition, the mixture was stirred at 50° C. for 3 hours. To the mixture, 125 g of NMP was added and thereby yielded a polymer solution D.

To the above-prepared polymer solution D, 8 g of the quinonediazide sulfonate (4) and 2.6 g of BIR-PC (trade name, available from Asahi Organic Chemicals Industry Co., Ltd.) as the compound having a phenolic hydroxyl group were dissolved and thereby yielded a varnish D of a photosensitive polyimide precursor composition. Using the prepared varnish D, a film of the photosensitive polyimide precursor was formed on a silicon wafer, was exposed and developed, and the sensitivity, film residual rate and resolution of the varnish were evaluated in the same manner as above.

EXAMPLE 5

Under flow of dried nitrogen gas, 5.41 g (0.016 mole) of p-phenylenediamine, 1.39 g (0.0056 mole) of 1,3-bis(3-aminopropyl)tetramethyldisiloxane and 6.16 g (0.078 mole) of pyridine were dissolved in 50 g of N-methyl-2-pyrrolidone (NMP) and were allowed to react at room temperature for 2 hours. To the resulting solution, 113.66 g (0.039 mole) of the solution (c) of diethyl 3,3'4,4'-benzophenonetetracarboxylate dichloride was added dropwise so that the temperature of the reaction system did not become 10° C. or higher. After the completion of addition, the mixture was stirred at room temperature for 4 hours. Subsequently, 2.72 g (0.0278 mole) of maleic anhydride as the endcapping agent was added, and the mixture was stirred at 50° C. for 3 hours. After the completion of reaction, the reaction mixture was put into 2 liters of water, and the precipitate of a solid polymer was collected by filtration. The solid polymer was then dried in a vacuum drier at 80° C. for 20 hours and thereby yielded a solid polymer E.

In 70 g of NMP, 10 g of the above-prepared solid polymer E, 2 g of the quinonediazide sulfonate (2) and 1 g of Bis-Z (trade name, available from Honshu Chemical Industry Co., Ltd.) were dissolved and thereby yielded a varnish E of a photosensitive polyimide precursor composition. Using the prepared varnish E, a film of the photosensitive polyimide precursor was formed on a silicon wafer, was exposed and developed, and the sensitivity, film residual rate and resolution of the varnish were evaluated in the same manner as above.

EXAMPLE 6

Under flow of dried nitrogen gas, 10.01 g (0.05 mole) of 4,4'-diaminodiphenyl ether, 0.65 g (0.0026 mole) of 1,3-bis (3-aminopropyl)tetramethyldisiloxane, 5.35 g (0.029 mole) of 4-carboxybenzoyl chloride as the endcapping agent and 8.11 g (0.103 mole) of pyridine were dissolved in 50 g of N-methyl-2-pyrrolidone (NMP). To the resulting solution, 104.6 g (0.037 mole) of the solution (b) of diethyl pyromellitate dichloride was added dropwise so that the temperature of the reaction system did not become 10° C. or higher. After the completion of addition, the mixture was stirred at room temperature for 6 hours. After the completion of reaction, the reaction mixture was put into 2 liters of water, and the precipitate of a solid polymer was collected by filtration. The solid polymer was then dried at 80° C. in a vacuum drier for 20 hours and thereby yielded a solid polymer F.

In 70 g of gamma-butyrolactone, 10 g of the above-prepared solid polymer F, 2 g of the quinonediazide sulfonate (2), 2.4 g of BIR-PC (trade name, available from Asahi Organic Chemicals Industry Co., Ltd.) as the compound having a phenolic hydroxyl group and 0.3 g of vinyltrimethoxysilane were dissolved and thereby yielded a varnish F of a photosensitive polyimide precursor composition. Using the prepared varnish F, a film of the photosensitive polyimide precursor was formed on a silicon wafer, was exposed and developed, and the sensitivity, film residual rate and resolution of the varnish were evaluated in the same manner as above.

EXAMPLE 7

To the polymer solution A obtained in Example 1, 7 g of the quinonediazide sulfonate (1) and 6.2 g of BisPC-PCHP (trade name, available from Honshu Chemical Industry Co., Ltd.) as the compound having a phenolic hydroxyl group were added and thereby yielded a varnish G of a photosensitive polyimide precursor composition. Using the prepared varnish G, a film of the photosensitive polyimide precursor was formed on a silicon wafer, was exposed and developed, and the sensitivity, film residual rate and resolution of the varnish were evaluated in the same manner as above.

EXAMPLE 8

In 70 g of gamma-butyrolactone, 10 g of the above-prepared solid polymer B obtained in Example 2, 2.9 g of the quinonediazide sulfonate (2), 3.5 g of 4PC (trade name, available from Asahi Organic Chemicals Industry Co., Ltd.) as the compound having a phenolic hydroxyl group and 0.3 g of vinyltrimethoxysilane were dissolved and thereby yielded a varnish H of a photosensitive polyimide precursor composition. Using the prepared varnish H, a film of the photosensitive polyimide precursor was formed on a silicon wafer, was exposed and developed, and the sensitivity, film residual rate and resolution of the varnish were evaluated in the same manner as above.

EXAMPLE 9

In 70 g of N-methyl-2-pyrrolidone, 10 g of the above-prepared solid polymer C obtained in Example 3, 1.7 g of the quinonediazide sulfonate (3) and 1.7 g of BIR-PCHP (trade name, available from Asahi Organic Chemicals Industry Co., Ltd.) as the compound having a phenolic hydroxyl group were dissolved and thereby yielded a varnish I of a photosensitive polyimide precursor composition. Using the prepared varnish I, a film of the photosensitive polyimide precursor was formed on a silicon wafer, was exposed and developed, and the sensitivity, film residual rate and resolution of the varnish were evaluated in the same manner as above.

EXAMPLE 10

In the polymer solution D obtained in Example 4, 8 g of the quinonediazide sulfonate (4) and 2.1 g of DML-MBPC (trade name, available from Honshu Chemical Industry Co., Ltd.) as the compound having a phenolic hydroxyl group were dissolved and thereby yielded a varnish J of a photosensitive polyimide precursor composition. Using the prepared varnish J, a film of the photosensitive polyimide precursor was formed on a silicon wafer, was exposed and developed, and the sensitivity, film residual rate and resolution of the varnish were evaluated in the same manner as above.

EXAMPLE 11

In the polymer solution A obtained in Example 1, 7 g of the quinonediazide sulfonate (1) and 2.5 g of DML-PC (trade name, available from Honshu Chemical Industry Co., Ltd.) as the compound having a phenolic hydroxyl group were dissolved and thereby yielded a varnish K of a photosensitive polyimide precursor composition. Using the prepared varnish K, a film of the photosensitive polyimide precursor was formed on a silicon wafer, was exposed and developed, and the sensitivity, film residual rate and resolution of the varnish were evaluated in the same manner as above.

EXAMPLE 12

In 70 g of gamma-butyrolactone, 10 g of the above-prepared solid polymer B obtained in Example 2, 2.9 g of the quinonediazide sulfonate (2), 1.6 g of DML-PTBP (trade name, available from Honshu Chemical Industry Co., Ltd.) as the compound having a phenolic hydroxyl group and 0.3 g of vinyltrimethoxysilane were dissolved and thereby yielded a varnish L of a photosensitive polyimide precursor composition. Using the prepared varnish L, a film of the photosensitive polyimide precursor was formed on a silicon wafer, was exposed and developed, and the sensitivity, film residual rate and resolution of the varnish were evaluated in the same manner as above.

EXAMPLE 13

In 70 g of N-methyl-2-pyrrolidone, 10 g of the above-prepared solid polymer C obtained in Example 3, 1.7 g of the quinonediazide sulfonate (3) and 1.0 g of 2,6-dimethoxymethyl-4-t-butylphenol (available from Honshu Chemical Industry Co., Ltd.) as the compound having a phenolic hydroxyl group were dissolved and thereby yielded a varnish M of a photosensitive polyimide precursor composition. Using the prepared varnish M, a film of the photosensitive polyimide precursor was formed on a silicon wafer, was exposed and developed, and the sensitivity, film residual rate and resolution of the varnish were evaluated in the same manner as above.

EXAMPLE 14

To the polymer solution A obtained in Example 1, 7 g of the quinonediazide sulfonate (1) and 3.8 g of 2,6-diacetoxymethyl-p-cresol as the compound having a phenolic hydroxyl group were added and thereby yielded a varnish N of a photosensitive polyimide precursor composition. Using the prepared varnish N, a film of the photosensitive polyimide precursor was formed on a silicon wafer, was exposed and developed, and the sensitivity, film residual rate and resolution of the varnish were evaluated in the same manner as above.

EXAMPLE 15

In 70 g of gamma-butyrolactone, 10 g of the above-prepared solid polymer B obtained in Example 2, 2.9 g of the quinonediazide sulfonate (2), 1.2 g of DML-PCHP (trade name, available from Honshu Chemical Industry Co., Ltd.), 1.2 g of BisPC-PCHP (trade name, available from Honshu Chemical Industry Co., Ltd.) as the compounds each having a phenolic hydroxyl group and 0.3 g of vinyltrimethoxysilane were dissolved and thereby yielded a varnish P of a photosensitive polyimide precursor composition. Using the prepared varnish P, a film of the photosensitive polyimide precursor was formed on a silicon wafer, was exposed and developed, and the sensitivity, film residual rate and resolution of the varnish were evaluated in the same manner as above.

EXAMPLE 16

A glass substrate carrying an indium-tin oxide (ITO) transparent electrode film 130-nm thick formed on the surface of alkali-free glass 1.1-mm thick by sputtering deposition was cut to a size of 120×100 mm. A photoresist was applied onto the cut ITO substrate and was patterned by exposure and development according to a conventional photolithography. The ITO film was then patterned in the form of a stripe by etching to remove unnecessary portions of the ITO film and then removing the photoresist. The resulting striped first electrode offered a 100-$\mu$m pitch.

Next, the varnish A obtained in Example 1 was adjusted in concentration using NMP, was applied onto the substrate carrying the first electrode by spin coating and was prebaked on a hot plate at 120° C. for 3 minutes. The resulting film was irradiated with ultraviolet rays through a photomask, was subjected to developing in a 2.38% tetramethylammonium hydroxide (TMAH) aqueous solution to dissolve exposed portions alone and was rinsed with pure water. The obtained patterned polyimide precursor was heated and cured in a clean oven in an atmosphere of nitrogen gas at 170° C. for 30 minutes and further at 320° C. for 60 minutes and thereby yielded an insulating layer so as to cover the edge of the first electrode. The resulting insulating layer had a thickness of about 1 $\mu$m.

Using the above-prepared substrate carrying the insulating layer, an organic electroluminescent device was manufactured. In this procedure, a thin film layer containing a luminescent layer was formed by vacuum deposition according to a resistant-wire heating technique. A hole-transporting layer was formed by vapor deposition on the entire surface of an effective area of the substrate, and a luminescent layer and an aluminum second electrode were formed using a shadow mask.

The resulting substrate was taken out from a vacuum metallizer and was sealed with a sealing glass plate using a curable epoxy resin. Thus, a passive-matrix color organic electroluminescent device was manufactured, which device included the substrate, the striped ITO first electrode formed on the substrate, the patterned luminescent layer formed on the first electrode, and the striped second electrode formed in a direction perpendicular to the first electrode. This display device was linearly and sequentially driven and thereby yielded satisfactory display characteristics. As the thin film layer and second electrode were smoothly formed without thinning or lack of the layers at the boundary of the insulating layer, the device could stably emit light without luminescent degradation. The patterned insulating layer had a cross section of tapered shape.

EXAMPLE 17

A passive-matrix color organic electroluminescent device was prepared in the same manner as in Example 16, except that the varnish G obtained in Example 7 was used and that the patterned polyimide precursor was cured at 230° C. for 30 minutes. The prepared display device was linearly and sequentially driven and thereby yielded satisfactory display characteristics without luminescent degradation.

EXAMPLE 18

A passive-matrix color organic electroluminescent device was prepared in the same manner as in Example 16, except that the varnish H obtained in Example 8 was used an that the patterned polyimide precursor was cured at 250° C. for 30 minutes. The prepared display device was linearly and sequentially driven and thereby yielded satisfactory display characteristics without luminescent degradation.

EXAMPLE 19

A passive-matrix color organic electroluminescent device was prepared in the same manner as in Example 16, except that the varnish K obtained in Example 11 was used and that the patterned polyimide precursor was cured at 230° C. for 30 minutes. The prepared display device was linearly and sequentially driven and thereby yielded satisfactory display characteristics without luminescent degradation.

EXAMPLE 20

A passive-matrix color organic electroluminescent device was prepared in the same manner as in Example 16, except that the varnish N obtained in Example 14 was used and that the patterned polyimide precursor was cured at 280° C. for 60 minutes. The prepared display device was linearly and sequentially driven and thereby yielded satisfactory display characteristics without luminescent degradation.

EXAMPLE 21

A passive-matrix color organic electroluminescent device was prepared in the same manner as in Example 16, except that the varnish P obtained in Example 15 was used and that the patterned polyimide precursor was cured at 250° C. for 60 minutes. The prepared display device was linearly and sequentially driven and thereby yielded satisfactory display characteristics without luminescent degradation.

COMPARATIVE EXAMPLE 1

A varnish Q of a photosensitive polyimide precursor composition was obtained in the same manner as in Example 1, except that, instead of 10.89 g, 12.77 g (0.064 mole) of 4,4'-diaminophenyl ether was used and that the endcapping agent was not used. Using the prepared varnish Q, a film of the photosensitive polyimide precursor was formed on a silicon wafer, was exposed and developed, and the sensitivity, film residual rate and resolution of the varnish were evaluated in the same manner as above.

COMPARATIVE EXAMPLE 2

A varnish R of a photosensitive polyimide precursor composition was obtained in the same manner as in Example 2, except that the endcapping agent was not used. Using the prepared varnish R, a film of the photosensitive polyimide precursor was formed on a silicon wafer, was exposed and developed, and the sensitivity, film residual rate and resolution of the varnish were evaluated in the same manner as above.

COMPARATIVE EXAMPLE 3

A varnish S of a photosensitive polyimide precursor composition was obtained in the same manner as in Example 3, except that the endcapping agent and TisP-PA as the compound having a phenolic hydroxyl group were not used. Using the prepared varnish S, a film of the photosensitive polyimide precursor was formed on a silicon wafer, was exposed and developed, and the sensitivity, film residual rate and resolution of the varnish were evaluated in the same manner as above.

COMPARATIVE EXAMPLE 4

A varnish T of a photosensitive polyimide precursor composition was obtained in the same manner as in Example 4, except that the endcapping agent was not used. Using the prepared varnish T, a film of the photosensitive polyimide precursor was formed on a silicon wafer, was exposed and developed, and the sensitivity, film residual rate and resolution of the varnish were evaluated in the same manner as above.

COMPARATIVE EXAMPLE 5

A varnish U of a photosensitive polyimide precursor composition was obtained in the same manner as in Example 7, except that the endcapping agent was not used. Using the prepared varnish U, a film of the photosensitive polyimide precursor was formed on a silicon wafer, was exposed and developed, and the sensitivity, film residual rate and resolution of the varnish were evaluated in the same manner as above.

COMPARATIVE EXAMPLE 6

A varnish V of a photosensitive polyimide precursor composition was obtained in the same manner as in Example 11, except that the endcapping agent was not used. Using the prepared varnish V, a film of the photosensitive polyimide precursor was formed on a silicon wafer, was exposed and developed, and the sensitivity, film residual rate and resolution of the varnish were evaluated in the same manner as above.

COMPARATIVE EXAMPLE 7

A varnish W of a photosensitive polyimide precursor composition was obtained in the same manner as in Example 1, except that Bis-Z as the compound having a phenolic hydroxyl group was not used. Using the prepared varnish W, a film of the photosensitive polyimide precursor was formed on a silicon wafer, was exposed and developed, and the sensitivity, film residual rate and resolution of the varnish were evaluated in the same manner as above.

COMPARATIVE EXAMPLE 8

A varnish X of a photosensitive polyimide precursor composition was obtained in the same manner as in Example 4, except that BIR-PC as the compound having a phenolic hydroxyl group was not used. Using the prepared varnish X, a film of the photosensitive polyimide precursor was formed on a silicon wafer, was exposed and developed, and the sensitivity, film residual rate and resolution of the varnish were evaluated in the same manner as above.

COMPARATIVE EXAMPLE 9

A varnish Y of a photosensitive polyimide precursor composition was obtained in the same manner as in Example 5, except that Bis-Z as the compound having a phenolic hydroxyl group was not used. Using the prepared varnish Y, a film of the photosensitive polyimide precursor was formed on a silicon wafer, was exposed and developed, and the sensitivity, film residual rate and resolution of the varnish were evaluated in the same manner as above.

COMPARATIVE EXAMPLE 10

A varnish Z of a photosensitive polyimide precursor composition was obtained in the same manner as in Example 1, except that, instead of Bis-Z as the compound having a phenolic hydroxyl group, the same amount of melamine was used. Using the prepared varnish Z, a film of the photosensitive polyimide precursor was formed on a silicon wafer, was exposed and developed, and the sensitivity, film residual rate and resolution of the varnish were evaluated in the same manner as above.

COMPARATIVE EXAMPLE 11

A passive-matrix color organic electroluminescent device was prepared in the same manner as in Example 16, except that the varnish Q obtained in Comparative Example 1 was used and that the patterned polyimide precursor was cured at 230° C. for 30 minutes. The prepared display device was linearly and sequentially driven, exhibited light emitting ununiformity at the edge of the luminescent display unit of the device and thereby yielded insufficient display characteristics, while no luminescent degradation was observed.

COMPARATIVE EXAMPLE 12

A passive-matrix color organic electroluminescent device was prepared in the same manner as in Example 16, except that the varnish S obtained in Comparative Example 3 was used and that the patterned polyimide precursor was cured at 250° C. for 60 minutes. The prepared display device was linearly and sequentially driven, exhibited significantly light emitting ununiformity at the edge of the luminescent display unit of the device and thereby yielded insufficient display characteristics, while no luminescent degradation was observed.

COMPARATIVE EXAMPLE 13

A passive-matrix color organic electroluminescent device was prepared in the same manner as in Example 16, except that the varnish W obtained in Comparative Example 7 was used and that the patterned polyimide precursor was cured at 300° C. for 60 minutes. The prepared display device was linearly and sequentially driven, exhibited significantly light emitting ununiformity at the edge of the luminescent display unit of the device and thereby yielded insufficient display characteristics, while no luminescent degradation was observed.

COMPARATIVE EXAMPLE 14

A passive-matrix color organic electroluminescent device was prepared in the same manner as in Example 16, except that the varnish X obtained in Comparative Example 8 was used and that the patterned polyimide precursor was cured at 200° C. for 60 minutes. The prepared display device was linearly and sequentially driven, exhibited light emitting ununiformity at the edge of the luminescent display unit and thereby yielded insufficient display characteristics, while no luminescent degradation was observed.

Table 1 shows the evaluations on Examples 1 to 15 and Comparative Examples 1 to 10.

TABLE 1

|  | Varnish | Endcapping Agent | Content (mole %) | Compound having a phenolic hydroxyl group | Additive | Sensitivity (mJ/cm$^2$) | Film residual rate (%) | Resolution ($\mu$m) |
|---|---|---|---|---|---|---|---|---|
| Ex. 1 | A | 3-aminophenol | 23.3 | Bis-Z |  | 216 | 95 | 3 |
| Ex. 2 | B | 1-carboxy-5-aminonaphthalene | 36.7 | BisRS-2P |  | 135 | 91 | 2 |
| Ex. 3 | C | active ester (a) | 35 | TrisP-PA |  | 162 | 92 | 5 |
| Ex. 4 | D | 3-hydroxyphthalic anhydride | 35 | BIR-PC |  | 189 | 92.5 | 3 |
| Ex. 5 | E | maleic anhydride | 50 | Bis-Z |  | 162 | 95 | 3 |
| Ex. 6 | F | 4-carboxybenzoyl chloride | 55 | BIR-PC |  | 108 | 93 | 2 |
| Ex. 7 | G | 3-aminophenol | 23.3 | BisPC-PCHP |  | 105 | 95 | 3 |
| Ex. 8 | H | 1-carboxy-5-aminonaphthalene | 36.7 | 4PC |  | 95 | 95 | 2 |
| Ex. 9 | I | active ester (a) | 35 | BIR-PCHP |  | 90 | 94 | 2 |
| Ex. 10 | J | 3-hydroxyphthalic anhydride | 35 | DML-MBPC |  | 70 | 95 | 3 |
| Ex. 11 | K | 3-aminophenol | 23.3 | DML-PC |  | 75 | 92 | 7 |
| Ex. 12 | L | 1-carboxy-5-aminonaphthalene | 36.7 | DML-PTBP |  | 75 | 91 | 7 |
| Ex. 13 | M | active ester (a) | 35 | 2,6-dimethoxymethyl-4-t-butylphenol |  | 70 | 92 | 6 |
| Ex. 14 | N | 3-aminophenol | 23.3 | 2,6-diacetoxymethyl-p-cresol |  | 70 | 92 | 6 |
| Ex. 15 | P | 1-carboxy-5-aminonaphthalene | 36.7 | DML-PCHP/BisPC-PCHP |  | 70 | 94 | 2 |
| Com. Ex. 1 | Q | None | 0 | Bis-Z |  | 648 | 95 | 20 |
| Com. Ex. 2 | R | none | 0 | BisRS-2P |  | 540 | 91 | 30 |
| Com. Ex. 3 | S | None | 0 | none |  | 972 | 95 | 40 |
| Com. Ex. 4 | T | None | 0 | BIR-PC |  | 540 | 93 | 15 |
| Com. Ex. 5 | U | None | 0 | BisPC-PCHP |  | 750 | 94 | 40 |
| Com. Ex. 6 | V | None | 0 | DML-PC |  | 650 | 93 | 35 |
| Com. Ex. 7 | W | 3-aminophenol | 23.3 | none |  | 450 | 93 | 75 |
| Com. Ex. 8 | X | 3-hydroxyphthalic anhydride | 35 | none |  | 380 | 92 | 80 |
| Com. Ex. 9 | Y | maleic anhydride | 50 | none |  | 450 | 93 | 85 |
| Com. Ex. 10 | Z | 3-aminophenol | 23.3 | none | melamine | 600 | 94 | 45 |

Other embodiments and variations will be obvious to those skilled in the art, and this invention is not to be limited to the specific matters stated above.

What is claimed is:

1. A composition of a positive photosensitive resin precursor, comprising:
   (a) a polyamic acid ester and/or a polyamic acid having at least one selected from the group consisting of a carboxyl group, a phenolic hydroxyl group, a sulfonic acid group, and a thiol group at the end of a principal chain of the polymer;
   (b) a compound having a phenolic hydroxyl group; and
   (c) a quinonediazide sulfonate.

2. The composition according to claim 1, wherein the polyamic acid ester and/or polyamic acid in the component (a) each mainly comprise at least one of structural units represented by following Formulae (1) and (2):

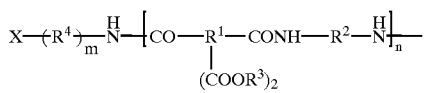
(1)

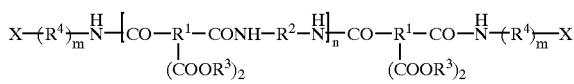
(2)

wherein R$^1$ is an organic group having a valency of 4; R$^2$ is an organic group having a valency of from 2 to 4; R$^3$ is a hydrogen atom and/or an organic group having from 1 to 20 carbon atoms; R$^4$ is an organic group having a valency of 2; X is an organic group having at least one of a carboxyl group, a phenolic hydroxyl group, a sulfonic acid group and a thiol group and having a valency of from 2 to 8; n is an integer of from 10 to 100000; and m is an integer of from 0 to 10.

3. The composition according to claim 1, wherein the polyamic acid ester and/or polyamic acid as the component (a) each mainly comprise at least one of structural units represented by following Formulae (3) and (4):

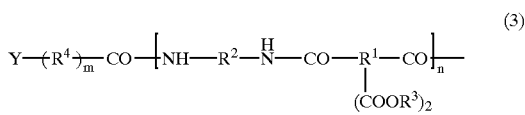
(3)

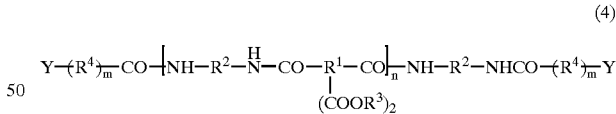
(4)

wherein R$^1$ is an organic group having a valency of 4; R$^2$ is an organic group having a valency of from 2 to 4; R$^3$ is a hydrogen atom and/or an organic group having from 1 to 20 carbon atoms; R$^4$ is an organic group having a valency of 2; Y is an organic group having at least one of a carboxyl group, a phenolic hydroxyl group, a sulfonic acid group and a thiol group and having a valency of from 2 to 8; n is an integer of from 10 to 100000; and m is an integer of from 0 to 10.

4. The composition according to claim 2, wherein m in Formula (1) is 0.

5. The composition according to claim 2, wherein m in Formula (2) is 0.

6. The composition according to claim 3, wherein m in Formula (3) is 0.

7. The composition according to claim 3, wherein m in Formula (4) is 0.

8. The composition according to claim 1, wherein the compound having a phenolic hydroxyl group as the component (b) is represented by Formula (5):

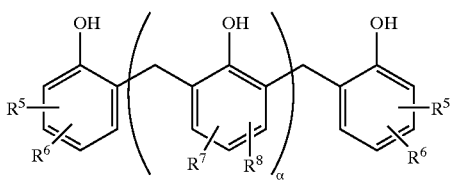

wherein each of $R^5$, $R^6$, $R^7$ and $R^8$ is independently a hydrogen atom, a hydroxyl group, an alkyl group having from 1 to 20 carbon atoms or an alicyclic group having from 4 to 20 carbon atoms; and a is an integer of from 0 to 5.

9. The composition according to claim 1, wherein the compound having a phenolic hydroxyl group as the component (b) is a thermally cross-linkable compound having an organic group represented by Formula (6):

wherein $R^9$ is a hydrogen atom, an alkyl group having from 1 to 20 carbon atoms, an alicyclic group having from 4 to 20 carbon atoms or an $R^{10}CO$ group, where $R^{10}$ is an alkyl group having from 1 to 20 carbon atoms.

10. The composition according to claim 9, wherein the thermally cross-linkable compound having an organic group represented by Formula (6) is represented by Formula (7):

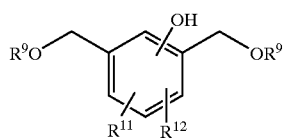

wherein $R^9$ is a hydrogen atom, an alkyl group having from 1 to 20 carbon atoms, an alicyclic group having from 4 to 20 carbon atoms or an $R^{10}CO$ group, where $R^{10}$ is an alkyl group having from 1 to 20 carbon atoms; $R^{11}$ and $R^{12}$ are each a hydrogen atom, an alkyl group having from 1 to 20 carbon atoms, an alicyclic group having from 4 to 20 carbon atoms or an $R^{13'}COO$ group, where $R^{13'}$ is an alkyl group having from 1 to 20 carbon atoms.

11. A display device comprising:

a substrate;

a first electrode formed on the substrate;

an insulating layer formed on the first electrode in such a manner that part of the first electrode is exposed; and a second electrode facing the first electrode, wherein the insulating layer comprises the composition of a positive photosensitive resin precursor as claimed in claim 1.

12. The display device according to claim 11, wherein the insulating layer is formed so as to cover the edge of the first electrode.

13. The display device according to claim 11, wherein the insulating layer has a cross section of the tapered shape in the boundary between a region where the first electrode is covered with the insulating layer and a region where the first electrode is exposed.

14. The display device according to claim 11, wherein the display device comprises an organic electroluminescent device comprising:

a substrate;

a first electrode on the substrate;

a thin film layer formed on the first electrode and including at least a luminescent layer comprising an organic compound; and a second electrode formed on the thin film layer.

* * * * *